(12) United States Patent
Gaide et al.

(10) Patent No.: US 8,773,164 B1
(45) Date of Patent: Jul. 8, 2014

(54) PROGRAMMABLE INTERCONNECT NETWORK

(71) Applicant: Xilinx, Inc., San Jose, CA (US)

(72) Inventors: Brian C. Gaide, Longmont, CO (US); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 114 days.

(21) Appl. No.: 13/666,271

(22) Filed: Nov. 1, 2012

(51) Int. Cl.
*H03K 19/173* (2006.01)

(52) U.S. Cl.
USPC .............................................. 326/38; 326/41

(58) Field of Classification Search
CPC ............ H03K 19/1737; H03K 19/177; H03K 19/17704; H03K 19/17728; H03K 19/17736; H03K 19/17744; H03K 19/173; H03K 19/1776; G06F 12/0813; G06F 15/167
USPC .................. 326/38–41, 47, 86, 101
See application file for complete search history.

(56) References Cited

U.S. PATENT DOCUMENTS

| | | | | |
|---|---|---|---|---|
| 5,455,521 | A * | 10/1995 | Dobbelaere ...................... | 326/17 |
| 6,393,303 | B1 * | 5/2002 | Katz .......................... | 455/562.1 |
| 6,958,627 | B2 * | 10/2005 | Singh et al. ..................... | 326/93 |
| 7,605,604 | B1 | 10/2009 | Young | |
| 7,746,106 | B1 * | 6/2010 | Gaide et al. ..................... | 326/38 |
| 7,746,110 | B1 | 6/2010 | Gaide et al. | |
| 7,746,111 | B1 * | 6/2010 | Gaide et al. ..................... | 326/41 |
| 7,759,974 | B1 | 7/2010 | Young | |
| 7,948,265 | B1 * | 5/2011 | Young et al. ..................... | 326/38 |
| 8,078,899 | B2 * | 12/2011 | Manohar et al. .............. | 713/375 |
| 8,294,490 | B1 * | 10/2012 | Kaviani .......................... | 326/41 |

OTHER PUBLICATIONS

U.S. Appl. No. 12/896,742, filed Oct. 1, 2010, Kaviani.
U.S. Appl. No. 12/896,720, filed Oct. 1, 2010, Kaviani.
U.S. Appl. No. 13/666,236, filed Nov. 1, 2012, Gaide et al.
Ferretti, Marcos et al., "Single-Track Asynchronous Pipeline Templates Using 1-of-N Encoding," *Proc. of the 2002 Design, Automation and Test in Europe Conference and Exhibition*, Mar. 4, 2002, pp. 1008-1015, IEEE Computer Society, Washington, DC, USA.
Nyström, Mika, "Asynchronous Pulse Logic" thesis, May 14, 2001, pp. 1-223, California Institute of Technology, Pasadena, California, USA.

\* cited by examiner

*Primary Examiner* — Vibol Tan
(74) *Attorney, Agent, or Firm* — W. Eric Webostad

(57) ABSTRACT

In an apparatus, an interconnect block includes a plurality of configuration memory cells. A plurality of multiplexers is respectively coupled to the configuration memory cells. An acknowledge circuit is coupled to the configuration memory cells. The acknowledge circuit includes a plurality of acknowledge inputs. The configuration memory cells are coupled to selectively set states of the plurality of multiplexers and correspondingly selectively activate inputs of the plurality of acknowledge inputs. A data ready circuit is coupled to at least one multiplexer output of the plurality of multiplexers.

20 Claims, 5 Drawing Sheets

PROGRAMMABLE INTERCONNECT NETWORK

TECHNICAL FIELD

An embodiment relates to integrated circuit devices ("ICs"). More particularly, an embodiment relates to a programmable interconnect network for an IC.

BACKGROUND

In conventional programmable logic devices ("PLDs"), including without limitation Field Programmable Gate Arrays ("FPGAs"), a programmable interconnect network ("routing fabric") is constructed where fanout is provided by "forking" an output wire and fanin is provided with programmable multiplexers. Asynchronous circuits, which may be self-timed event driven circuits, may be difficult to implement in such a conventional interconnect network. Hence, it is desirable and useful to provide a programmable interconnect network more suitable for asynchronous circuits for ICs, including without limitation PLDs.

SUMMARY

In an apparatus, an interconnect block includes a plurality of configuration memory cells. A plurality of multiplexers is respectively coupled to the configuration memory cells. An acknowledge circuit is coupled to the configuration memory cells. The acknowledge circuit includes a plurality of acknowledge inputs. The configuration memory cells are coupled to selectively set states of the plurality of multiplexers and correspondingly selectively activate inputs of the plurality of acknowledge inputs. A data ready circuit is coupled to at least one multiplexer output of the plurality of multiplexers.

Another apparatus includes a sender block. A plurality of receiver blocks is coupled to the sender block. Each of the plurality of receiver blocks includes a plurality of configuration memory cells. Each of the plurality of receiver blocks includes a plurality of multiplexers respectively coupled to the configuration memory cells. Each of the plurality of receiver blocks includes an acknowledge circuit coupled to the configuration memory cells. The acknowledge circuit includes a plurality of acknowledge inputs. The configuration memory cells are coupled to selectively set states of the plurality of multiplexers and correspondingly selectively activate inputs of the plurality of acknowledge inputs. A data ready circuit is coupled to a multiplexer output of the plurality of multiplexers.

BRIEF DESCRIPTION OF THE DRAWINGS

Accompanying drawings show exemplary block and circuit diagrams. However, the accompanying drawings should not be taken to limit the embodiments shown, but are for explanation and understanding only.

FIGS. 4-1 through 4-3 are block diagrams depicting respective exemplary bidirectional interconnects for asynchronous channels.

DETAILED DESCRIPTION

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing the exemplary circuits illustratively depicted in the several figures, a general introduction is provided to further understanding.

Figure 2:
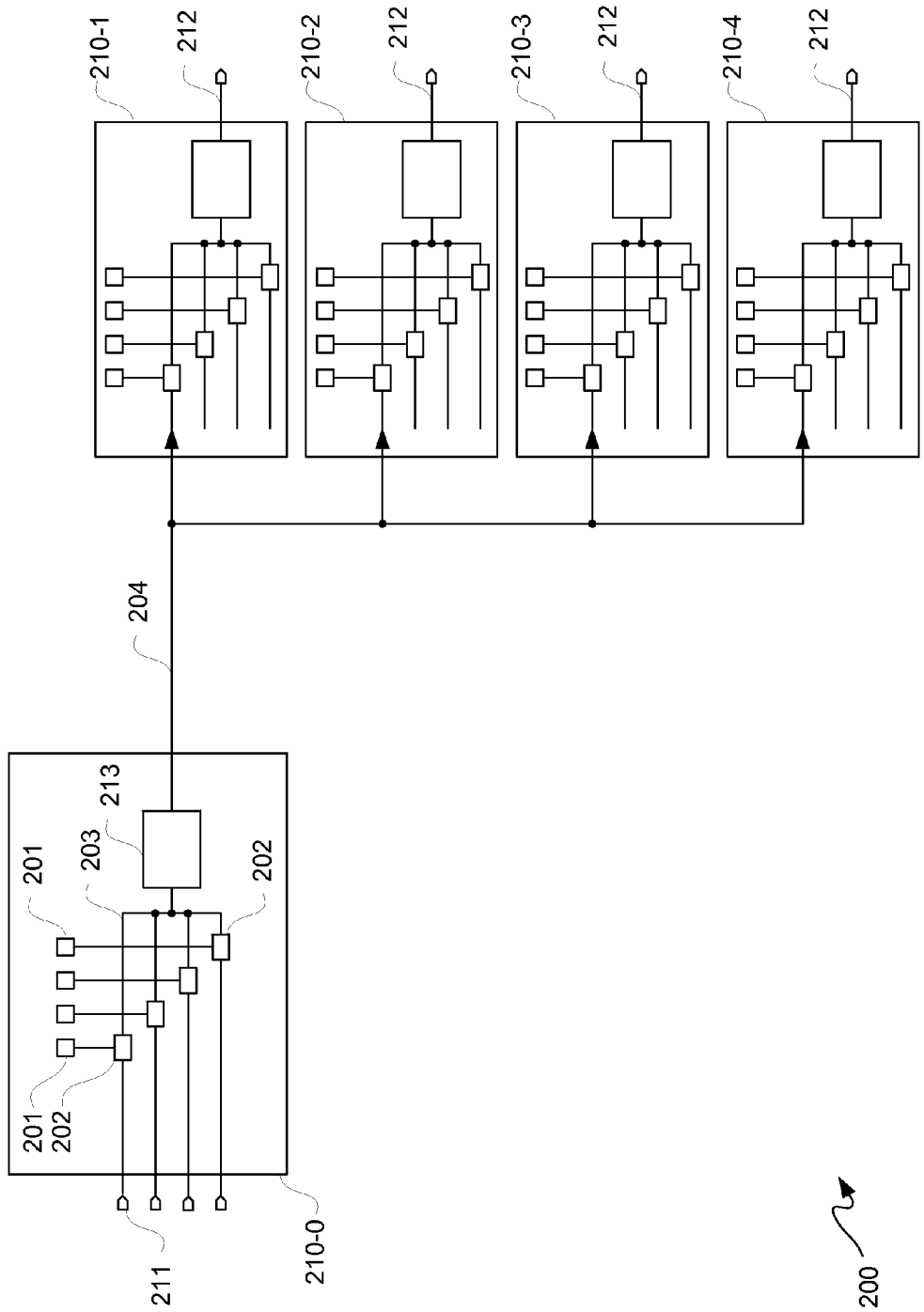
FIG. 2 is a block diagram depicting an exemplary conventional interconnect network of the FPGA of FIG. 1.

A conventional programmable interconnect network, such as described in additional detail with reference to FIG. 2, causes problems for a self-timed circuit environment. Because data may be selectively fanned out to multiple destinations, a main acknowledgement signal cannot be asserted as provided to a data sender until all selected circuit loads have provided acknowledgements in order to provide such main acknowledgement. However, the information used to determine which circuit loads have been selected may be distributed over a large area of an IC die, and may consume a significant number of configuration memory bit resources and/or routing resources. This distribution may cost extra metal routes and/or additional configuration memory cells, and further such distribution may delay acknowledge input, either or both of which may make having a self-timed circuit environment problematic.

As described below in additional detail, multiplexers of a programmable interconnect network may be used for fanout, in contrast to fanout provided by forking an output wire. This means that configuration memory cells used to control multiplexers or other pass gating circuits may be located proximate to such multiplexers. Furthermore, because there is a correspondence between selected fanned out signals and selected circuit loads, configuration memory cells or other control circuit may be used for controlling both multiplexers of a programmable interconnect network and programmable acknowledge circuitry. Moreover, such multiplexers, configuration memory cells, and programmable acknowledge circuitry may be co-located in an interconnect block of such programmable interconnect network. Having all of such resources proximate to one another facilitates layout or efficient implementation for programmable event driven circuitry, namely facilitates use of such programmable interconnect network for self-timed circuit applications by reducing the physical amount of metal or routing. This may be more useful as devices become smaller and smaller, as synchronous or clock driven data channels tend to be less appealing than self-time or event driven asynchronous channels.

With the above general understanding borne in mind, various exemplary interconnect networks are generally described below.

Because one or more of the described circuits are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 1:
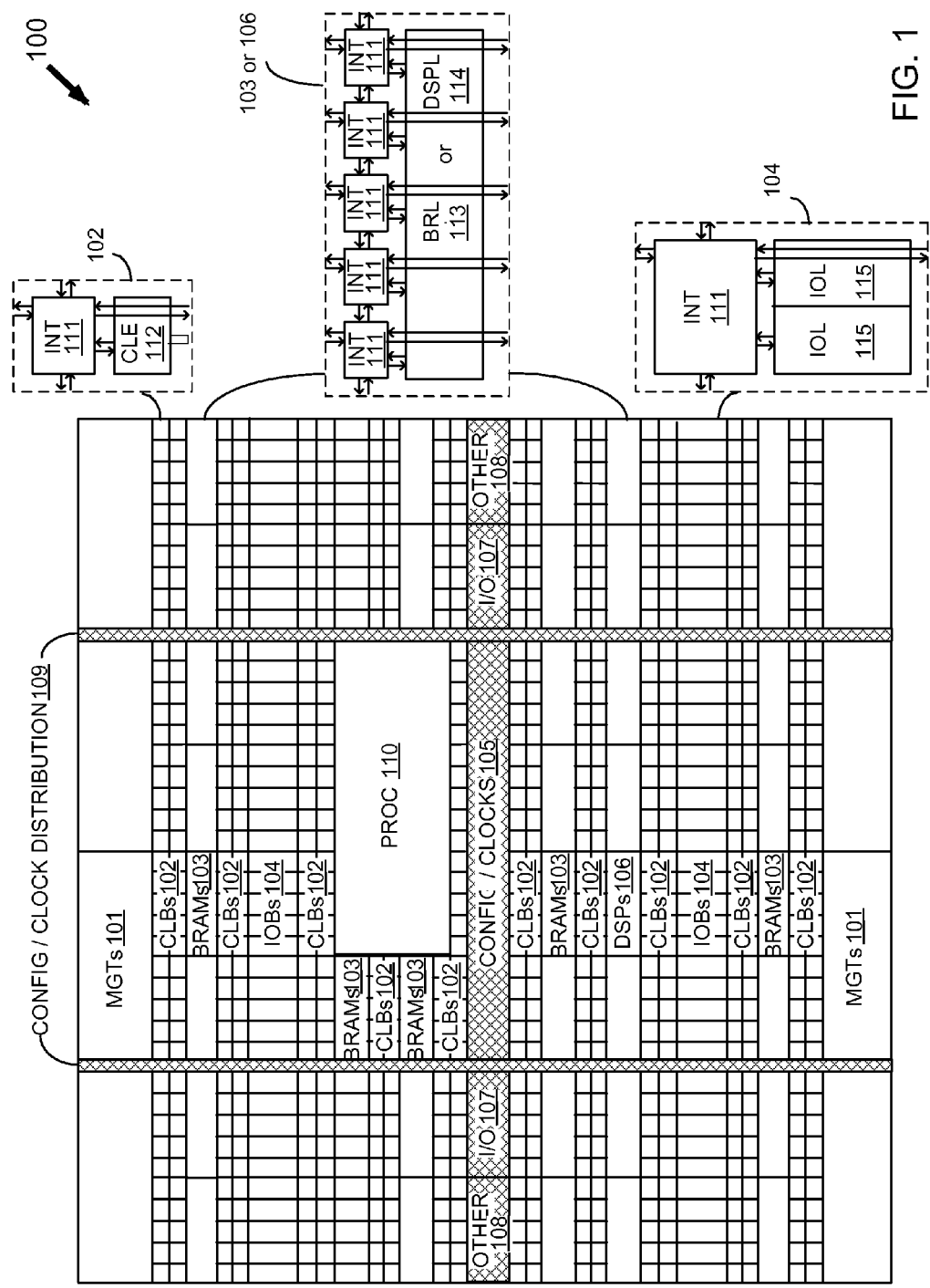
FIG. 1 is a simplified block diagram depicting an exemplary columnar Field Programmable Gate Array ("FPGA") architecture.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

FIG. 2 is a block diagram depicting an exemplary conventional interconnect network 200 of FPGA 100 of FIG. 1. Interconnect network 200 includes interconnect blocks 210-0 through 210-4 ("interconnect blocks 210"). Even though five interconnect blocks are illustratively depicted, fewer or more interconnect blocks 210 may be present in an FPGA 100. Each interconnect block 210 includes pass gate multiplexers 202, configuration memory cells 201, and an output buffer or driver 203. Even though pass or transmission gate multiplexers 202 are illustratively depicted, in other embodiments other types of multiplexer circuits may be used for multiplexers 202, such as for example NAND gate trees, among others.

Output of interconnect block 210-0 is unidirectional and is coupled as input to each of interconnect blocks 210-1 through 210-4. In this example, each interconnect block 210 includes four signal inputs 211 respectively provided to four pass gate multiplexers 202. Control signals for putting each of multiplexers 202 in either a pass through state or a no pass through state, namely respectively a conductive state or a non-conductive state, may be provided from configuration memory cells 201 to corresponding multiplexers 202. Configuration memory cells 210 may be programmed using a configuration bitstream.

Outputs of multiplexers 202 are all coupled to a common node 203, which is an input node of output buffer 213. Output buffer 213 may be a series of inverters, for example. Output from output buffer 213 is driven unidirectionally on interconnect wire 204. Interconnect wire 204 is also a common input node for a respective multiplexer 202 of each of interconnect blocks 210-1 through 210-4.

Thus, for conventional interconnect network 200, which may be part of FPGA routing fabric, fanout from output of buffer 213 is provided by "forking" an interconnect wire 204. Furthermore, fanin is provided by programming configuration memory cells 201 to set state of programmable pass gate multiplexers 202 to select an active node. Accordingly, only one multiplexer 202 of an interconnect block 210 may be in a pass through mode or state at a time. Some of inputs to interconnect blocks 210-1 through 210-4 may be coupled to other interconnect blocks 210-0 and/or to local circuitry. Furthermore, outputs 212 of interconnect blocks 210-1 through 210-4 may be provided to other circuits or loads.

However, conventional interconnect network 200 is not well suited for a self-timed circuit environment. For self-timed operation, if an upstream circuit sends data to a downstream circuit, an acknowledgement of receipt of such data is provided by such downstream circuit to such upstream circuit. Thus, when data is fanned out to multiple destinations, an acknowledgement may not be sent to a data sender until all data receivers have acknowledged receipt of such data.

Accordingly, when data is selectively fanned out from interconnect block 210-0 to one or more of interconnect blocks 210-1 through 210-4 by selectively programming configuration memory cells 201 to selectively put one or more pass gate multiplexers in a pass through state, information to determine which loads associated with pass gate multiplexers in a pass through state have been selected may be distributed over a large area of a die. This may negatively impact performance of self-timed circuitry by having long delays for routing acknowledgments back to a data sender and/or may involve a substantial amount of additional routing circuitry.

Figure 3:
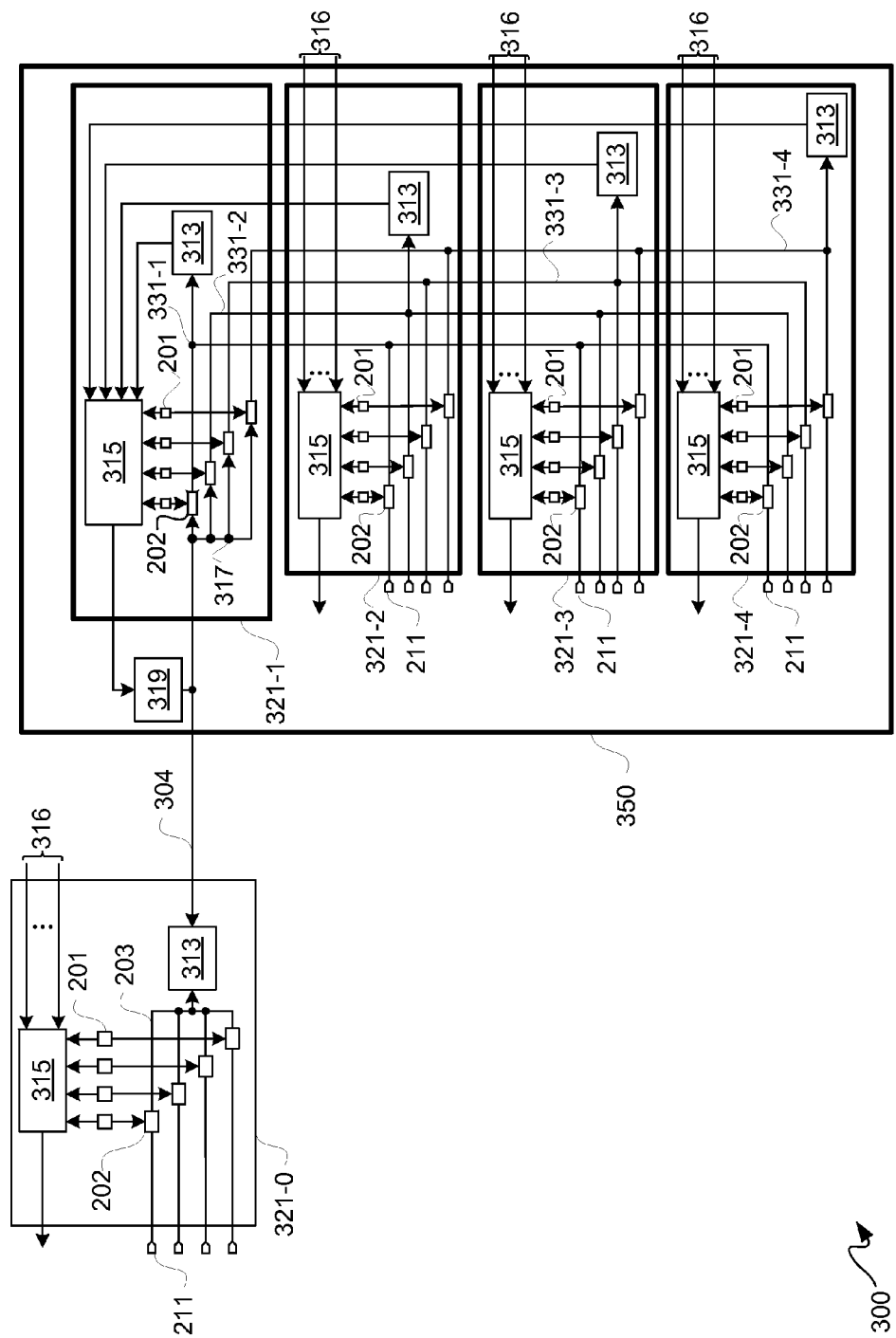
FIG. 3 is a block diagram depicting an exemplary interconnect network for the FPGA of FIG. 1.

FIG. 3 is a block diagram depicting an exemplary interconnect network 300 of FPGA 100 of FIG. 1. Even though an FGPA is used by way of example, other types of integrated circuits may use interconnect network 300, including without limitation any integrated circuit with programmable network resources.

Interconnect network 300 includes a plurality of interconnect blocks 321-0 through 321-4. Each interconnect block of interconnect blocks 321-0 through 321-4 includes a plurality of configuration memory cells 201; a plurality of multiplexers 202 respectively coupled to configuration memory cells 201; an acknowledge circuit 315 coupled to configuration memory cells 201, and a data ready circuit 313 coupled to at least one multiplexer output of multiplexers 202. Multiplexers 202 are pass gate multiplexers. At the outset, it should be appreciated that configuration memory cells 201, as well as pass gate multiplexers 202, are co-located in a same interconnect block 321 as acknowledge circuit 315. This co-location of configuration memory cells 201, pass gate multiplexers 202, and acknowledge circuitry 315 may reduce overall metal usage in forming an integrated circuit. Again, proximity of configuration memory cells 201, pass gate multiplexers 202, and acknowledge circuitry 315 to one another may facilitate layout or efficient implementation for programmable event driven circuitry, namely may facilitate use of such programmable interconnect network for self-timed circuit applications by reducing the physical amount of metal or routing.

Figure 6:
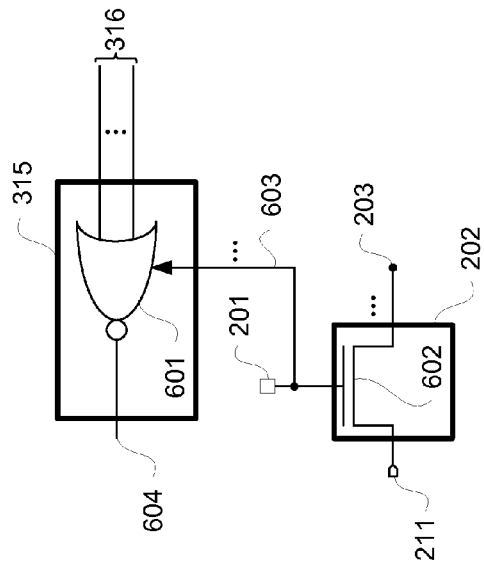
FIG. 6 is a block/circuit diagram depicting an exemplary pass gate multiplexer and acknowledge circuit coupled to a configuration memory cell.

FIG. 6 is a block/circuit diagram depicting an exemplary pass gate multiplexer 202 and an acknowledge circuit 315 coupled to a configuration memory cell 201. Configuration memory cell 201 may be programmed, such as with a configuration bitstream, to output either a logic high or a logic low. For purposes of clarity by way of example and not limitation, it shall be assumed that, when programmed, configuration memory cell 201 outputs a logic high or binary one, and, when not programmed, configuration memory cell 201 outputs a logic low or binary zero. There are other configuration memory cells 201 with respective control signal inputs 603 to acknowledge circuit 315 and to other pass gate multiplexers 202.

Acknowledge circuit 315 in this example includes a programmable NOR gate 601. However, in other embodiments, other types of logic gate circuitry may be used in accordance with the following description. Programmable NOR gate 601 includes a plurality of acknowledge inputs 316. Each control signal input 603 may be respectively associated with an acknowledge input 316. Thus, for example, if configuration memory cell 210 is programmed to output a logic high, such configuration memory cell 210 output may be used to provide an associated control signal input 603 to activate an associated acknowledge input 316. Thus, for example, if one or more of acknowledge inputs 316 are active, then states of such one or more active acknowledge inputs 316 is used in determining state of output 604 of programmable NOR gate 601. Thus, for example for programmable NOR gate 601 to output a logic 1 on output 604, all activated acknowledge inputs 316 will be a logic 0. This signaling may be used to ensure all downstream loads have acknowledged receipt, as well as passing, of data before outputting a logic 1 from programmable NOR gate 601. Output 604 may be coupled to a circuit load (not shown).

In this example, pass gate multiplexer 202 includes an NMOS transistor 602. However, in other embodiments, a PMOS transistor may be used. Furthermore, in other embodiments more than one transistor, PMOS and/or NMOS, may be used. A signal input 603 may be coupled to a gate of NMOS transistor 602. Thus, configuration memory cells 201 are coupled to selectively set states of multiplexers 202. In this example, if configuration cell 201 outputs a logic 1 on signal input 603, NMOS transistor 602 is put into a substantially conductive or ON state, which allows any signal on input node 211 to be passed to output node 203.

Configuration memory cells 202 are coupled to both selectively set states of multiplexers 202 and correspondingly selectively activate inputs of acknowledge inputs 316. For example, configuration memory cells 202 may be used to control both programmable NOR gate 601 and pass gate transistors 602, or, more generally, may be used to control both acknowledge circuit 315 and multiplexers 202. Thus, by having configuration memory cells 202 local to both acknowledge circuit 315 and multiplexers 202 and by using such configuration memory cells 202 control both acknowledge circuit 315 and multiplexers 202, fewer configuration memory cells 202 may be used.

Returning to FIG. 3, multiplexers 202 of interconnect block 321-0 have corresponding fanin input nodes 211 and a common output node 203 to which an input of data ready circuit 313 is connected. An output interface of data ready circuit 313 may be connected to a bidirectional interconnect 304.

Figure 5:
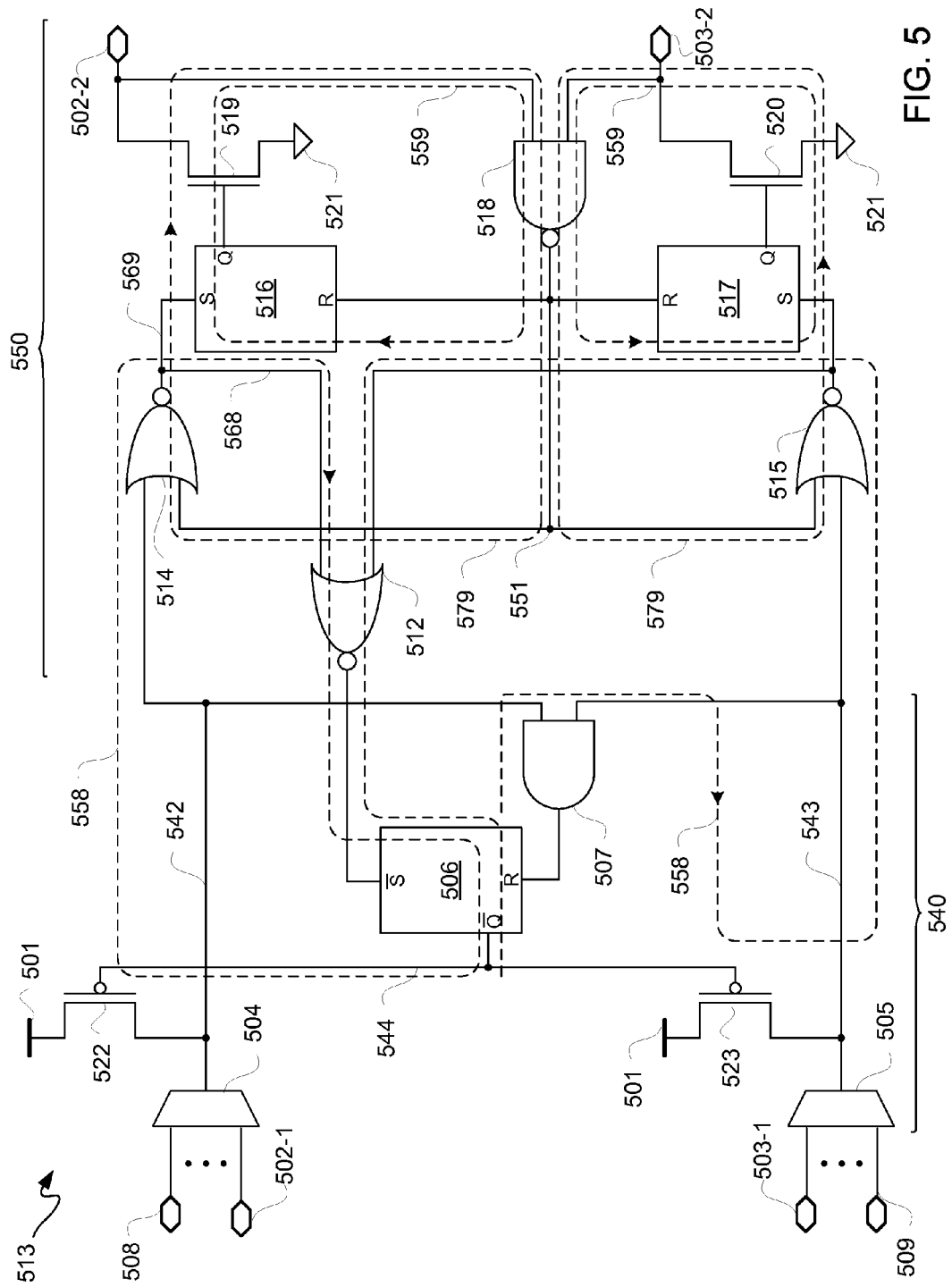
FIG. 5 is a block/circuit diagram depicting an exemplary data ready circuit.

FIG. 5 is a block/circuit diagram depicting an exemplary single-track full buffer (STFB) 513. STFB 513 may be an embodiment of data ready circuit 313 of FIG. 3. STFB 513 is a dual-rail single track type of buffer. STFB 513 includes an input stage 540 and an output stage 550. Input stage 540 of one STFB 513 in combination with output stage 550 of a previous STFB 513 coupled to such input stage 540 may provide a pulse generator, as described in additional detail in a co-pending and commonly-assigned patent application entitled "Self-Timed Single Track Circuit", filed concurrently herewith, which is incorporated by reference herein in its entirety for all purposes. Even though STFB 513 is illustratively depicted; in other embodiments other single-track buffers may be used.

Loops 558 and 559 are independent from one another with respect to timing. There are upper and lower loops 558 and 559 as associated with a true side and a false side, respectively. For purposes of clarity and not limitation, generally only the upper loop 558 is described, as description of both the upper and lower loops 558 and 559 would be repetitive.

Once output from NOR gate 514 is provided along a feedback path of loop 558 and into a set port of SR latch 516 of loop 559, timing of going through such loops is decoupled from one another. More particularly, timing associated with turning on and off an output driver, such as NMOS transistors 519 and 520 for example, is determined by loop 559 and not determined by loop 558. Thus, a feedback signal output from NAND gate 518 of output stage 550 may be used for self-timed operation of output stage 550 independent from input stage 540. In other words, capacitive loading on output stage 550 is decoupled from capacitive loading on input stage 540 of STFB 513. Therefore, for example, a short pulse width of an input pulse on an input stage for example is not necessarily going to be too short for an output stage due to a high capacitive loading on such output stage.

Furthermore, outputs of NOR gates 514 and 515 are each forked. For example, a branch 568 of the output of NOR gate 514 is provided as feedback for feedback loop 558, and a branch 569 of the output of NOR gate 514 and a common branch 551 of the output of NAND gate 518 is provided as feed forward input of a feedback loop 579. Feedback loop 559 may be within feedback loop 579. The faster input to have an effect on output of NOR gate 514, namely from feedback branch 568 of feedback loop 558 or feed forward branch 569 of feedback loop 579, is used to deassert a set input of SR latch 516. This is useful to avoid a condition due to significantly delay deassertion of a set input of an output SR latch 516 due to heavy capacitive loading on output driver transistor 519. In other words, by having either loop path 558 or 579 deassert a set input on SR latch 516, next data is prevented from arriving while an output channel of an output stage 550 is still full due to such capacitive loading. Lower loops and branches are not described to avoid repetition, but likewise may be used to deassert a set input on SR latch 517.

Input rail 502-1 and input rail 503-1 may be predetermined as being either a "true" side or a "false" side. A "true" side may be referred to a logic high data side, and a "false" side may be referred to a logic low data side; however, this does not mean that the actual data on such sides is either only logic high or logic low. Rather, it means if a signal is asserted on a logic high side, such signal represents a logic high even if such signal itself is not a logic high. Furthermore, such two rails 502-1 and 503-1 may be used to communicate both state and readiness of data and an acknowledgement that data was received, as described below in additional detail. For purposes of clarity and not limitation it shall be assumed that input rail 502-1 is a true side rail, and that input rail 503-1 is a false side rail. Likewise, it shall be assumed that output rail 502-2 and output rail 503-2 respectively are a true side and a false side.

STFB 513 may be used as an FPGA interconnect or other interconnect. However, STFB 513 may be used for multiplexing, buffering, driving, and/or interconnecting, among other circuit functions, and may be used in ICs other than FPGAs. Thus, any IC with asynchronous channels for self-timed operation may employ STFB 513.

Multiple input wires 508 and multiple input wires 509 may respectively be provided to optional multiplexers 504 and 505. Configuration memory cells 201 of FIG. 3 may be coupled to multiplexers 504 and 505 to provide control select signals thereto. Multiplexers 504 and 505 may be multiplexers 202 of FIG. 3. For purposes of clarity and not limitation, it shall be assumed that fanin input wires 508 and 509 are not used, and that input rails 502-1 and 503-1, as well as optional multiplexers 504 and 505 are used.

If outputs of multiplexers 504 and 505 are both at logic high states, then no data is present on an input interface to input stage 540. If one output of multiplexers 504 and 505 is logic low, and the other output of multiplexers 504 and 505 is logic high, then data is present on the input interface to input stage 540. Assuming an active low operation, then continuing the above example that input rail 502-1 is the true side, if output of multiplexer 504 is logic low, then the data state is logic high. Likewise, if output of multiplexer 505 is logic low, then the data state is logic low. Outputs of both of multiplexers 504 and 505 may be prevented from both transitioning to low at the same time on rails 542 and 543. Rather, instructions or protocol may be used to prevent both of rails 542 and 543 from being logic low at the same time. Furthermore, an STFB 513 itself, if surrounded by other STFBs 513, is guaranteed not to have both rails low simultaneously by STFB 513 itself. So instructions and protocol may be enforced on the boundaries of the set of STFBs 513 to prevent both rails 542 and 543 from going low at the same time, but logic within STFB 513 itself is such that assuming boundary conditions are met, both rails 542 and 543 cannot go low at the same time.

Input stage 540 effectively is a portion of a pulse generator, as described below in additional detail. Input stage 540 includes voltage pull-up PMOS transistors 522 and 523, AND gate 507, and SR latch 506. Input stage 540 may optionally include multiplexers 504 and 505. SR latch 506 may be a reset-dominant SR latch.

Output of multiplexer 504 is provided via node 542 as an input to NOR gate 514 and to AND gate 507. Output of multiplexer 504 is coupled to a drain node of PMOS transistor 522. A source node of PMOS transistor 522 is coupled to a supply voltage 501, such as Vdd for example.

Output of multiplexer 505 is provided via node 543 as an input to NOR gate 515 and to AND gate 507. Output of multiplexer 505 is coupled to a drain node of PMOS transistor 523. A source node of PMOS transistor 523 is coupled to a supply voltage 501, such as Vdd for example.

Output of AND gate 507 is provided to a reset input port ("R") of SR latch 506. A complemented output ("Q bar") of SR latch 506 provided to gates of PMOS transistors 522 and 523 via node 544. Output NOR gate 512 is provided to a complemented set input port ("S bar") of SR latch 506.

Output stage 550 effectively provides a portion of a pulse generator and provides a feedback controller, as described below in additional detail. Output stage 550 includes NOR gates 512, 514 and 515, SR latches 516 and 517, NMOS pull-down transistors 519 and 520, and NAND gate 518. SR latches 516 and 517 may be reset-dominant SR latches.

NAND gate 518, NOR gate 512, and NOR gates 514 and 515 are part of a feedback path 558 from output stage 550 to SR latch 506 of input stage 540. Feedback associated with state of output stage 550 is provided to input stage 540 to decouple pulse widths associated with input stage 540 and output stage 550.

Output of NOR gate 514 is provided as an input to a set ("S") input port of SR latch 516 and to an input of NOR gate 512. An output ("Q") of SR latch 516 is provided to a gate of NMOS transistor 519. A source node of NMOS transistor 519 is coupled to a ground 521, and a drain node of NMOS transistor 520 is coupled to output rail 502-2 and to an input of NAND gate 518.

Output of NOR gate 515 is provided as an input to a set ("S") input port of SR latch 517 and to another input of NOR gate 512. An output ("Q") of SR latch 517 is provided to a gate of NMOS transistor 520. A source node of NMOS transistor 520 is coupled to ground 521, and a drain node of NMOS transistor 520 is coupled to output rail 503-2 and to another input of NAND gate 518.

Output of NAND gate 518 is provided to reset input ports of SR latches 516 and 517, as well as other inputs of NOR gates 514 and 515, via node 551. Again, output of NOR gate 512 is provided to a complemented or inverted set port of SR latch 506.

For purposes of clarity and not limitation, it shall be assumed that no data is present on the output interface of output stage 550. Therefore, it shall be assumed that both of output rails 502-2 and 503-2 are logic high. Further, for purposes of clarity by way of example not limitation, it shall be assumed that output of multiplexer 504 is a logic low and that output of multiplexer 505 is logic high. In other words, continuing the above example, it shall be assumed that a data state representing a logic high is at the input interface of input stage 540.

For output rails 502-2 and 503-2 both being a logic high, such as having voltages on such rails being pulled up by corresponding PMOS pull-up transistors to transistors 522 and 523 of a subsequent input stage 540, output of NAND gate 518 is logic low. Thus, output of NOR gate 514 is logic high, and output of NOR gate 515 is logic low.

Output of NOR gate 512 is a logic low responsive to a logic high output from either of outputs of NOR gates 514 and 515. Thus, a logic high output from NOR gate 514 causes output of NOR gate to be logic low. A logic low on either of rails 542 or 543 causes output of AND gate 507 to be logic low. A logic low output from NOR gate 512 for input to a S bar port of SR latch 506 and a logic low output from AND gate 507 for input to an R port of SR latch 506 means that output from a Q bar port of SR latch is a logic low. Effectively, this means that a feedback shut off signal from output stage 550 is received by NOR gates 514 and 515 to cause outputs of either of those gates to cause a logic low to be output from SR latch 506.

With both S bar and R inputs to SR latch 506 being logic low, complement output of SR latch 506 outputs a logic low. For a logic low output from a complemented output port of SR latch 506 to gates of PMOS transistors 522 and 523, then those transistors electrically couple supply voltage 501 to rails or nodes 542 and 543, respectively. By pulling up a voltage on a rail 542 from a logic low to a logic high, effectively and end of an inverse pulse is provided by such transition. The beginning of such pulse may be generated by initiating a logic low on rail 542, which may be caused by coupling rail 542 to a ground 521, such as by an output driver 519 of a previous output stage 550.

Generally, once a data bit is detected on a rail, namely a change in state on an input wire, such data value is latched, and almost simultaneous with latching of such data value, both input wires are reset to be ready for a next data bit. Resetting of such input wires, such as pulling up voltage on rails 542 and 543 to logic high, may be used to communicate to a previous stage, such as a previous output stage 550 for example, an acknowledgment of receipt of data and a state of readiness for sending the next data bit. However, input stage 540 is not actually ready to receive a next bit of data at this time, because both PMOS transistors 522 and 523 would be on and driving a rail of rails 542 and 543 low would consume a significant amount of power. Input stage 540 will actually be ready to receive a next data bit when both PMOS transistors 522 and 523 are off; however, an indication of readiness may be sent prior to such PMOS transistors 522 and 523 being off, as such PMOS transistors 522 and 523 will shortly be shut off, as described below in additional detail with reference to feedback from output stage 550. In other words, there is a race condition to turn off PMOS transistors 522 and 523 to electrically decouple rails 542 and 543 from Vdd 501 before such one of such rails is coupled to ground 521 by an output driver transistor 519 or 520, respectively, of an immediately adjacent upstream output stage 550.

Continuing the above example, outputs of NOR gates 514 and 515 are respectively logic high and logic low. For a logic high provided to a set input port of SR latch 516, a non-complimented or true output ("Q") of SR latch 516 is logic high. Such a logic high output from SR latch 516 which is provided to a gate of NMOS transistor 519, causes NMOS transistor 519 to electrically couple output node or rail 502-2 to ground. In other words, the data received by input stage 540 has been received, buffered, and now passed downstream as an output by output stage 550.

For a logic low provided to a set input port of SR latch 517, a non-complimented output of SR latch 517 is logic low. Such a logic low output from SR latch 517 gating NMOS transistor 520 maintains NMOS transistor 520 in a substantially non-conductive or off state. Thus, output node or rail 503-2 is still electrically decoupled from ground.

By electrically coupling output rail 502-2 to ground 521, an inverse pulse is initiated by output stage for passing data to a downstream input stage 540. In other words, an output driver of output drivers, such as NMOS transistors 519 and 520 in this example, of an output stage 550 may be used to start generation of a pulse, namely cause output stage 550 to start generating a pulse for output. Furthermore, by feedback through gates coupled to output rails, such an output of such output drivers may be used to cause an input stage 540 end a pulse.

A logic low from output rail 502-2 and input to NAND gate 518 causes NAND gate 518 to output a logic high or one. A logic high or one from NAND gate 518 cause one of SR latches 516 and 517 to reset, namely output a logic low or zero from its non-complemented output port, and the other of such SR latches 516 and 517 maintains its state even through reset is asserted. These logic lows output from SR latches 516 and 517 turn off one of NMOS transistors 519 and 520 to decouple a rail of rails 502-2 and 503-2, respectively, from ground 521. This allows a subsequent input stage or input driver stage to pull-up voltage on such rail, for reasons as previously described.

It should be understood that input drivers, such PMOS transistors 522 and 523, of a downstream input stage may be used to pull voltage on output rails 502-2 and 503-2 to logic highs or ones. This causes NAND gate 518 to output a logic zero or low, as previously described. However, when one of output rails 502-2 and 503-2 is pulled to a logic low, output from NAND gate 518 is a logic high. An output of a logic high from NAND gate 518 causes outputs from NOR gates 514 and 515 to both be logic lows. Logic lows output from NOR gates 514 and 515 cause output of NOR gate 512 to be a logic high, and a logic high input to a complemented set input port of SR latch 506 does not cause any change in state of output from such SR latch 506. Logic lows respectively input to set input ports of SR latches 516 and 517 do not cause any change in states of outputs of those latches.

As previously described, pulling up voltage on input rails 542 and 543 may be performed after output driver transistors 519 and 520 are both electrically decoupled from ground 521. Logic high voltage on input rails 542 and 543 is an acknowledgement of receipt of data and an indication of readiness to receive new data. However, once both of input rails 542 and 543 are logic high, output of AND gate 507 transitions to logic high. A logic high output from AND gate 507 causes SR latch to reset, namely output a logic high from its complemented output port. This causes both PMOS transistors 522 and 523 to turn off to decouple rails 542 and 543 from Vdd 501 to be ready for the next data bit. In other words, by turning off PMOS transistors 522 and 523, STFB 513 can avoid drawing contention current with an upstream device. Furthermore, there is a very brief time between acknowledgement and decoupling of input rails 542 and 543 from Vdd 501, so as to avoid any possibility of drawing such contention current. In other words, there is a race condition that comes out correctly between an upstream transmitter and a downstream receiver.

By having the output of a one of NOR gates 514 and 515 control assertion of a "set" input of one of SR latches 516 and 517, as previously described, a functional failure may be prevented. For example, a functional failure could result if deassertion of one set input of such SR latches 516 and 517 was delayed too much due a heavily loaded output associated therewith. This may be due to an imbalance in capacitive or other loading on output rails for example. By having either one of NOR gates 514 or 515 output control, a next bit of data is prevented from arriving while the output channel is still full. Accordingly, as described above, each output stage pulse generation is individually reset by sensing voltage on output rails, and each input stage pulse generation is individually reset by sensing voltage on input rails.

Additionally, STFB 513 has built-in delays that reduce the likelihood of overlapping pulses, namely when one output stage sends data and a receiving input stage immediately acknowledges, or vice versa. As indicated above, such overlapping pulses may result in lower or no short circuit current. However, as described above, turning off either a data forwarding pulse or a data acknowledging pulse involves traveling through fewer logic stages than shutting off a stage. This time difference provided by gate delays provides timing margin to reduce the likelihood of overlapping pulses. In addition to gate delays, there may be wire delays due to parasitic capacitance.

As pulse generation of an input stage 540 may be independent from pulse generation of output stage 550, a designer has freedom to change drive strength of PMOS and NMOS drivers, such as PMOS transistors 522 and 523 and NMOS transistors 519 and 520 for example. For example, NMOS transistors 519 and 520 may be substantially larger than PMOS transistors 522 and 523.

STFB 513 of FIG. 5 is for a single active fanout. In STFB 513, circuitry of each of multiplexers 504 and 505 may be self-contained such that all fanout loads need not be located close together.

Output wires 502-2 and 503-2 may be coupled to bidirectional interconnect 304, which may be for a self-timed asynchronous network. Along those lines, a bidirectional interconnect 304 of FIG. 3 may be for a single-track data channel; a bundled-data channel, or a dual-rail data channel. In other words, even though output wires or rails 502-2 and 503-2 are for a dual rail single track configuration, a data ready circuit 313 may be for a single-track data channel; a bundled-data channel, or a dual-rail data channel.

Returning to FIG. 3, bidirectional interconnect 304 is connected to an input node 317 of interconnect block 321-1. Input node 317 is an input node common to multiplexers 202 of interconnect block 321-1 for fanin. Along those lines, interconnect block 321-0 may be coupled to be a sender block, and interconnect blocks 321-1 through 321-4 may be coupled as a plurality of receiver blocks coupled to such sender block. In contrast to interconnect wire 204 of FIG. 2 which is forked for fanout to multiple interconnect blocks 210-1 through 210-4, bidirectional interconnect 304 is only provided to a single interconnect block 321-1.

Receiver block 321-1 is an initial or first receiver block of a plurality of receiver blocks and is coupled to a sender block 321-0 via a bidirectional interconnect 304, as previously described. A first multiplexer 202 of each of the plurality of multiplexers 202 of each of the plurality of receiver blocks 321-1 through 321-4 is coupled to one another at a first common output node 331-1. A second multiplexer 202 of each of the plurality of multiplexers 202 of each of the plurality of receiver blocks 321-1 through 321-4 is coupled to one another at a second common output node 331-2. A third multiplexer 202 of each of the plurality of multiplexers 202 of each of the plurality of receiver blocks 321-1 through 321-4 is coupled to one another at a third common output node 331-3. A fourth multiplexer 202 of each of the plurality of multiplexers 202 of each of the plurality of receiver blocks 321-1 through 321-4 is coupled to one another at a fourth common output node 331-4. Each of multiplexers 202 of each of interconnect blocks 321-2 through 321-4 are respectively coupled to signal inputs 211.

An input of a data ready circuit 313 of a first receiver block 321-1 of the plurality of receiver blocks 321-1 through 321-4 is coupled to a first common output node 331-1. An input of a data ready circuit 313 of a second receiver block 321-2 of the plurality of receiver blocks 321-1 through 321-4 is coupled to a second common output node 331-2. An input of a data ready circuit 313 of a third receiver block 321-3 of the plurality of receiver blocks 321-1 through 321-4 is coupled to a third common output node 331-3. An input of a data ready circuit 313 of a fourth receiver block 321-4 of the plurality of receiver blocks 321-1 through 321-4 is coupled to a fourth common output node 331-4.

A first acknowledge input of a plurality of acknowledge inputs 316 of acknowledge circuit 315 of a first receiver block 321-1 is coupled to an output of a data ready circuit 313 of a first receiver block 321-1. A second acknowledge input of a plurality of acknowledge inputs 316 of acknowledge circuit 315 of a first receiver block 321-1 is coupled to an output of a data ready circuit 313 of a second receiver block 321-2. A third acknowledge input of a plurality of acknowledge inputs 316 of acknowledge circuit 315 of a first receiver block 321-1 is coupled to an output of a data ready circuit 313 of a third receiver block 321-3. A fourth acknowledge input of a plurality of acknowledge inputs 316 of acknowledge circuit 315 of a first receiver block 321-1 is coupled to an output of a data ready circuit 313 of a fourth receiver block 321-4.

Figures 1, 4:
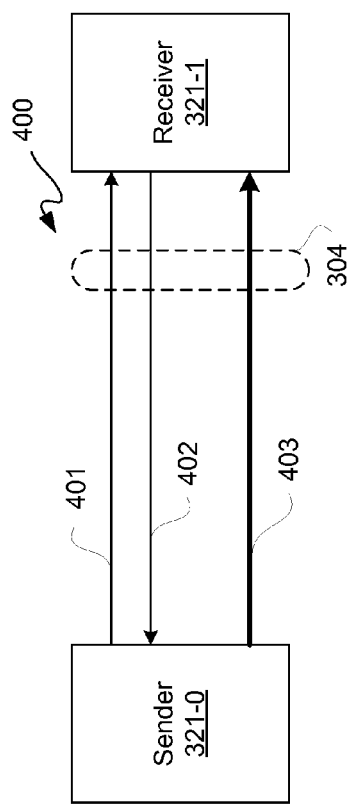
Figures 2, 4:
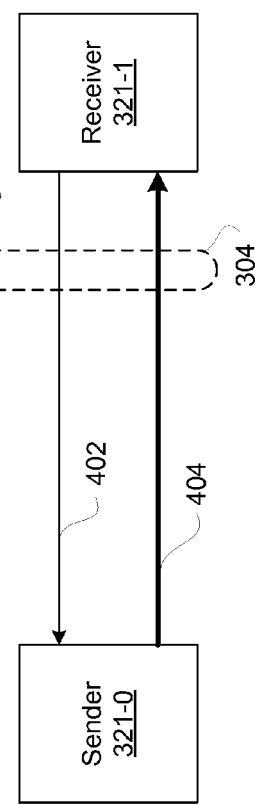
Figures 3, 4:
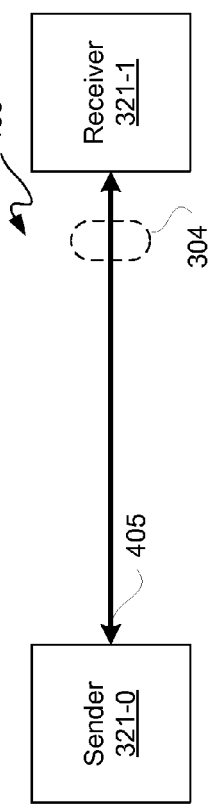

An acknowledge output of acknowledge circuit 315 of a first receiver block 321-1 may be coupled to bidirectional interconnect 304 via a interconnect block 319, and such interconnect block may include a transistor gated by output of acknowledge circuit 315 and coupled to bidirectional interconnect 304 as a voltage pull-up or pull-down device. As previously indicated, bidirectional interconnect 304 may be any of a variety of configurations FIGS. 4-1 through 4-3 are block diagrams depicting respective exemplary bidirectional interconnects 304 for asynchronous channels 400. With reference to FIG. 4-1, for example, a sender interconnect block 321-0 may be coupled to a receiver interconnect block 321-1 via a bidirectional interconnect 304 which includes a request signal line 401, an acknowledge signal line 402, and a single rail data interconnect 403. Along those lines, a request to send data may be sent on request signal line 401 from sender interconnect block 321-0 to receiver interconnect block 321-1; an acknowledgement may be sent on acknowledgement signal line 402 from receiver interconnect block 321-1 to sender interconnect block 321-0; and data may be sent as single rail data on interconnect 403 from sender interconnect block 321-0 to receiver interconnect block 321-1. In this configuration, asynchronous channel 400 is configured as a bundled-data channel.

With reference to FIG. 4-2, in another example, a sender interconnect block 321-0 may be coupled to a receiver interconnect block 321-1 via a bidirectional interconnect 304 which includes an acknowledge signal line 402 and a 1-of-N data interconnect 404. Along those lines, an acknowledgement may be sent on acknowledgement signal line 402 from receiver interconnect block 321-1 to sender interconnect block 321-0; and data may be sent on 1-of-N data interconnect 403 from sender interconnect block 321-0 to receiver interconnect block 321-1. In this configuration, asynchronous channel 400 is configured as a 1-of-N data channel.

With reference to FIG. 4-3, in yet another example, a sender interconnect block 321-0 may be coupled to a receiver interconnect block 321-1 via a bidirectional interconnect 304 which includes a 1-of-N data and acknowledgement interconnect 405. Along those lines, an acknowledgement and data may be sent on 1-of-N data and acknowledgement interconnect 405 between sender interconnect block 321-0 and receiver interconnect block 321-1. In this configuration, asynchronous channel 400 is configured as a 1-of-N single-track channel.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
an interconnect block including:
a plurality of configuration memory cells;
a plurality of multiplexers respectively coupled to the configuration memory cells;
an acknowledge circuit coupled to the configuration memory cells;
wherein the acknowledge circuit includes a plurality of acknowledge inputs;
wherein the configuration memory cells are coupled to selectively set states of the plurality of multiplexers and correspondingly selectively activate inputs of the plurality of acknowledge inputs; and
a data ready circuit coupled to at least one multiplexer output of the plurality of multiplexers.

2. The apparatus according to claim 1, wherein the plurality of multiplexers have a common output node to which an input of the data ready circuit is connected.

3. The apparatus according to claim 1, wherein the data ready circuit has a data-acknowledge interface coupled to a bidirectional interconnect.

4. The apparatus according to claim 3, wherein the bidirectional interconnect is for an asynchronous channel selected from a group consisting of a single-rail single track data channel; a bundled-data channel, and a dual-rail single-track data channel.

5. The apparatus according to claim 1, wherein the data ready circuit has an acknowledge interface coupled to the acknowledge circuit as one of the plurality of acknowledge inputs.

6. The apparatus according to claim 1, wherein the plurality of multiplexers are pass gate multiplexers.

7. The apparatus according to claim 1, wherein the data ready circuit is a single-track full buffer.

8. The apparatus according to claim 1, wherein the interconnect block is of a programmable logic device.

9. An apparatus, comprising:
a sender block;
a plurality of receiver blocks coupled to the sender block;
wherein each of the plurality of receiver blocks includes:
a plurality of configuration memory cells;
a plurality of multiplexers respectively coupled to the configuration memory cells;
an acknowledge circuit coupled to the configuration memory cells;
wherein the acknowledge circuit includes a plurality of acknowledge inputs;
wherein the configuration memory cells are coupled to selectively set states of the plurality of multiplexers and correspondingly selectively activate inputs of the plurality of acknowledge inputs; and
a data ready circuit coupled to a multiplexer output of the plurality of multiplexers.

10. The apparatus according to claim 9, wherein an initial receiver block of the plurality of receiver blocks is coupled to the sender block via a bidirectional interconnect.

11. The apparatus according to claim 10, wherein the plurality of multiplexers of the initial receiver block have a common input node to which the bidirectional interconnect is coupled.

12. The apparatus according to claim 10, wherein the bidirectional interconnect is for an asynchronous channel selected from a group consisting of a single-rail single track data channel; a bundled-data channel, and a dual-rail single-track data channel.

13. The apparatus according to claim 9, wherein:
a first multiplexer of each of the plurality of multiplexers of each of the plurality of receiver blocks is coupled to one another at a first common output node; and
a second multiplexer of each of the plurality of multiplexers of each of the plurality of receiver blocks is coupled to one another at a second common output node.

14. The apparatus according to claim 13, wherein a first input of the data ready circuit of a first receiver block of the plurality of receiver blocks is coupled to the first common output node.

15. The apparatus according to claim 14, wherein a second input of the data ready circuit of a second receiver block of the plurality of receiver blocks is coupled to the second common output node.

16. The apparatus according to claim 15, wherein a first acknowledge input of the plurality of acknowledge inputs of the acknowledge circuit of the first receiver block is coupled to an output of the data ready circuit of the first receiver block.

17. The apparatus according to claim 16, wherein a second acknowledge input of the plurality of acknowledge inputs of the acknowledge circuit of the first receiver block is coupled to an output of the data ready circuit of the second receiver block.

18. The apparatus according to claim 14, wherein the first receiver block of the plurality of receiver blocks is coupled to the sender block via a bidirectional interconnect.

19. The apparatus according to claim 18, wherein an acknowledge output of the acknowledge circuit of the first receiver block is coupled to the bidirectional interconnect.

20. The apparatus according to claim 9, wherein the data ready circuit is a single-track full buffer.

\* \* \* \* \*